(12) United States Patent
Gris et al.

(10) Patent No.: US 6,689,672 B2
(45) Date of Patent: Feb. 10, 2004

(54) BURIED LAYER MANUFACTURING METHOD

(75) Inventors: Yvon Gris, Tullins (FR); Thierry Schwartzmann, Le Versoud (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/832,170

(22) Filed: Apr. 10, 2001

(65) Prior Publication Data

US 2001/0044195 A1 Nov. 22, 2001

(30) Foreign Application Priority Data

Apr. 10, 2000 (FR) .............................. 00 04587

(51) Int. Cl.$^7$ .......................................... H01L 21/263
(52) U.S. Cl. .................... 438/522; 438/423; 438/526
(58) Field of Search ................... 438/424, 423, 438/522, 526, 527

(56) References Cited

U.S. PATENT DOCUMENTS

| | | | |
|---|---|---|---|
| 4,862,240 A | | 8/1989 | Watanabe et al. |
| 4,906,585 A | * | 3/1990 | Neppl et al. ................. 438/424 |
| 5,021,845 A | * | 6/1991 | Hashimoto ................. 357/23.4 |
| 5,480,832 A | * | 1/1996 | Miura et al. ................. 438/424 |
| 6,121,089 A | * | 9/2000 | Zeng et al. ................. 438/268 |
| 6,133,615 A | * | 10/2000 | Guckel et al. ............... 257/446 |

OTHER PUBLICATIONS

French Preliminary Search Report from 0004587, filed Apr. 10, 2000.
Patent Abstracts of Japan, vol. 014, No. 28 (E–875), Jan. 19, 1990 & JP 01 265554 A Oct. 23, 1989.
Patent Abstracts of Japan, vol. 018, No. 359 (E–1574), Jul. 6, 1994 & JP 06 097275 A Apr. 8, 1994.

* cited by examiner

*Primary Examiner*—Caridad Everhart
(74) *Attorney, Agent, or Firm*—Lisa K. Jorgenson; James H. Morris; Wolf, Greenfield & Sacks, P.C

(57) ABSTRACT

A method of forming separate buried layers close to one another in a semiconductor component. This method includes the steps of forming, by implantation, doped areas in a semiconductor substrate; performing an anneal just sufficient to eliminate crystal defects resulting from the implantation; depositing an epitaxial layer; digging trenches delimiting each implanted region; and annealing the buried layers, the lateral diffusion of which is blocked by said trenches, said trenches being deeper than the downward extension of the diffusions resulting from said implantations.

24 Claims, 2 Drawing Sheets

BURIED LAYER MANUFACTURING METHOD

BACKGROUND OF THE INVENTION

1. Field of the Invention

The present invention relates to the field of semiconductor circuit manufacturing, and more specifically to the forming of buried layers between a substrate and an epitaxial layer.

2. Discussion of the Related Art

Such a structure is shown as an example in FIG. 1. The substrate is designated by reference 1, the epitaxial layer is designated by reference 2, and buried layers are designated by references 3, 4, and 5. If layers 3 and 5 are of the same type, they will have at the end of the process the same extension in height. If layer 4 is of a different type, it may have a height different from that of layers 3 and 5.

Conventionally, these buried layers are formed by implantation of selected dopants in the substrate before the epitaxial layer is formed. The implantation step is necessarily followed by a brief restructuring anneal to eliminate structural defects induced in the substrate by the implantation. Indeed, if such structural defects were left to remain, the epitaxial layer could exhibit defects. However, usually, a stronger anneal than the anneal necessary for only the substrate restructuring is performed. After the epitaxy step, due to various anneal steps necessary to a satisfactory activation of the buried layers and inevitably resulting from the integrated circuit manufacturing, the buried layers have diffused vertically and laterally with respect to the initial location of the implantation. Thus, to take account of the lateral diffusion, a minimum distance has to be provided between two masks of definition of implanted regions intended for forming buried layers of opposite types. Otherwise, neighboring buried layers would join, which would bring about various disadvantages well known by those skilled in the art, especially as concerns the breakdown voltage of the device and the creation of stray capacitances, not to mention the fact that, due to the mixing between implanted areas of distinct types, the doping characteristics initially aimed at are not obtained.

Further, intrinsically, the fact of having to provide diffusions after implantation of the buried layers results in that it is not possible to go under a minimum effective dimension for the implantation openings if optimal doping levels are desired to be obtained with reasonable implantation doses.

As an example, FIG. 2 shows diffusion profiles resulting from the implantation of arsenic through openings of various widths in implantation masks. Direction x is parallel to the surface of a substrate, and the profile is studied at a depth at which the concentration maximum appears. These profiles correspond to a bidimensional simulation. The results are worse in practice since the third dimension would have to be taken into account. In the various cases shown, the implantation dose was $4.10^{15}$ at./cm$^2$. In FIG. 2, the ordinates are in atoms/cm$^3$ and the abscissas in micrometers.

For curve 11, the mask opening width is 0.4 μm; it can be seen that the maximum concentration at the center of the buried layer is $10^{19}$ atoms/cm$^3$ and the width at mid-height is 1.6 μm.

For curve 12, the mask opening width is 1.4 μm; it can be seen that the maximum concentration at the center of the buried layer is $2.10^{19}$ atoms/cm$^3$ and the width at mid-height is 2.6 μm.

For curve 13, the mask opening width is 3.4 μm; it can be seen that the maximum concentration at the center of the buried layer is $2.6.10^{19}$ atoms/cm$^3$ and the width at mid-height is 4 μm.

For curve 14, the mask opening width is 7.4 μm; it can be seen that the maximum concentration at the center of the buried layer is $2.6.10^9$ atoms/cm$^3$ and the width at mid-height is 8 μm.

Thus, it can be seen that, in these conditions, the maximum doping aimed at at the center of the buried layer is only obtained for a mask having an opening greater than 3.4 μm. For smaller masks, due to diffusions, the maximum concentration decreases. Further, even for a mask of minimum dimension (0.4 μm), due to the lateral diffusion, the resulting curve extends over a width greater than 2 μm. A significant guard distance must thus be provided between two distinct buried layers, for example a distance greater than 1.5 μm.

U.S. Pat. No. 4,862,240 provides for separating two adjoining buried layers of opposite types by a trench. A drawback of this method is that the trench must be wide enough to eliminate the area wherein the dopant of opposite types coexists.

SUMMARY OF THE INVENTION

The present invention aims at overcoming the various disadvantages discussed hereabove and especially at enabling formation of buried layers close to one another and having a high maximum doping level.

To achieve this and other objects, the present invention provides a method of forming separate buried layers close to one another in a semiconductor component, including the steps of forming, by implantation, doped areas in a semiconductor substrate; performing an anneal just sufficient to eliminate crystal defects resulting from the implantation; depositing an epitaxial layer; digging trenches delimiting each implanted region; and annealing the buried layers, the lateral diffusion of which is blocked by the trenches, which are deeper than the downward extension of the diffusions resulting from the implantations.

According to an embodiment of the present invention, the guard between the trench-forming mask and the implantation-forming mask is on the order of 0.2 μm.

According to an embodiment of the present invention, the first anneal is performed at a temperature on the order of 900° C. for a duration shorter than one hour.

According to an embodiment of the present invention, the second anneal is performed at a temperature greater than 1000° C. for a duration greater than 20 minutes.

According to an embodiment of the present invention, the implantations are performed at a dose between $10^{14}$ and $10^{16}$ atoms/cm$^2$.

According to an embodiment of the present invention, at least one of the implanted areas is formed above a region previously implanted of the opposite conductivity type and previously annealed.

According to an embodiment of the present invention, the previously-implanted region diffuses sufficiently to extend under trenches and join buried layers formed on the other side of these trenches.

The foregoing objects, features and advantages of the present invention, will be discussed in detail in the following non-limiting description of specific embodiments in connection with the accompanying drawings.

DETAILED DESCRIPTION

Figure 3A:
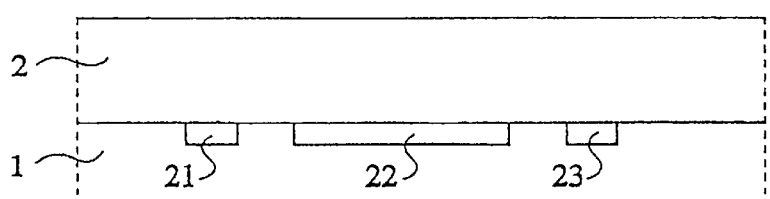
FIGS. 3A to 3C illustrate successive steps of a method according to the present invention.

As shown in FIG. 3A, a first step of the method according to the present invention includes forming in a single-crystal silicon substrate 1 implanted regions 21, 22, 23, then performing a minimum anneal for restructuring the silicon and elimination of defects. An anneal at 850° C. for 20 minutes will, for example, be performed. After this, an epitaxial layer 2 is formed by a low-temperature epitaxy, for example over a thickness from 1.5 to 2 μm. During this epitaxy, which is currently performed at a temperature on the order of 900° C., the atoms implanted in regions 21, 22, 23, do not diffuse for practical purposes.

Figure 3B:
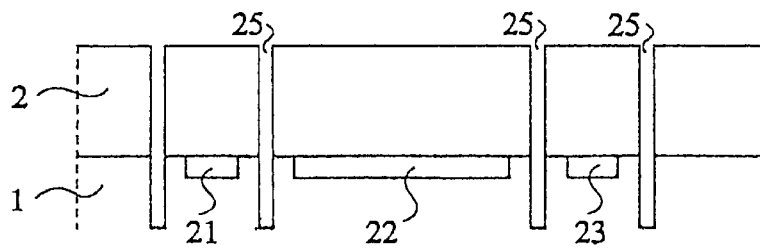

At a next step, illustrated in FIG. 3B, narrow trenches 25 which surround implanted regions 21, 22, 23, are formed. The trenches will have the minimum width allowed by the manufacturing technology, for example currently on the order of 0.3 μm and will be distant from the limits of regions 21, 22, 23 by a guard distance sufficient to be sure that, despite possible manufacturing defects, the trenches do not cut the diffusion limits of regions 21, 22, 23 at this stage of the process. As an example, a guard distance of 0.2 μm will be provided between the estimated limits of the diffused regions and the trench edges.

Figure 3C:
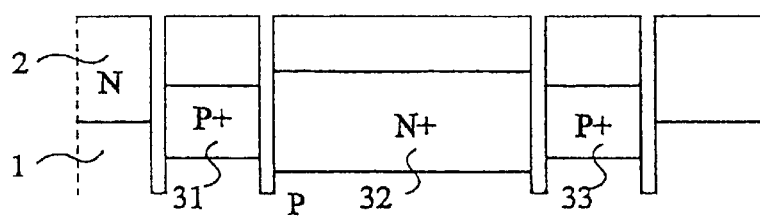

Only at a subsequent step illustrated in FIG. 3C is a high-temperature anneal performed, for example at 1100° C. for 20 minutes, to ensure an activation and a diffusion of implanted areas 21, 22, 23 intended for forming buried layers 31, 32, 33 and for simultaneously passivating the trench flanks. The trenches are dug sufficiently deep so that the lower limits of layers 31, 32, 33 do not reach down under the bottom of the trenches.

Figure 1:
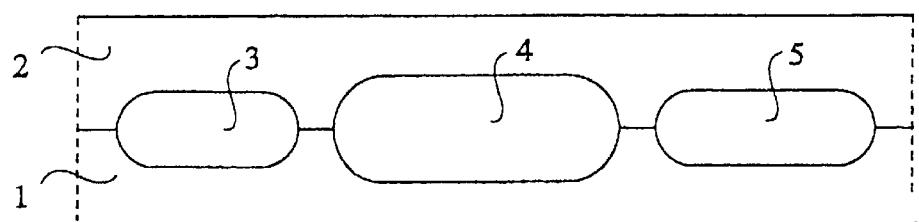
FIG. 1, previously described, illustrates a conventional buried layer structure.
Figure 2:
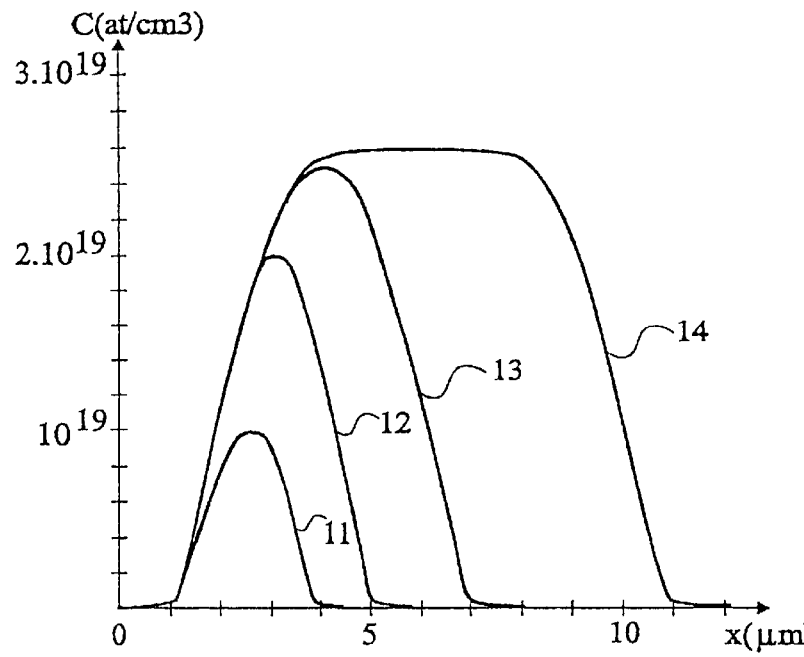
FIG. 2, previously described, shows a curve of the concentration as a function of the width of an implantation opening.

The lateral guard distance between the limits of trenches 25 and the borders of implanted areas 21, 22, 23 being generally much smaller than the extension of the normal lateral diffusion of implanted areas 21, 22, 23, the structure can have reduced dimensions as compared to what is illustrated in FIG. 1. On the other hand, as concerns the narrowest buried layers, for example areas 31 and 33, according to an advantage of the present invention, an increased dopant concentration is obtained in these areas after diffusion, due to the fact that the dopants diffuse little by lateral diffusion.

Another advantage of providing trenches formed to limit the lateral extension of implanted dopants is that, given that the trench flanks are in contact with very heavily-doped areas, it is not necessary to provide specific channel stop implantations/diffusions as are often implemented at the bottom of trenches.

Finally, as compared to the case where a first quite extensive diffusion step is performed before epitaxy, after which a second diffusion step is carried out after epitaxy, the doping front of the upper side according to the present invention is more rounded, which is more favorable to avoid latch-up phenomena when MOS-type transistors are formed in the epitaxial layer. In structures of bipolar type in which the buried layer is intended to correspond to a collector, it will be however, attempted to increase the steepness of the diffusion fronts, for which purpose a deep collector implantation of same type as the buried layer implantation is preferably performed after epitaxy.

Purposefully, no specific conductivity type has been indicated for the substrate and the epitaxial layer. In many cases, the substrate is lightly P-type doped and the epitaxial layer is of type N, possibly adjusted or inverted as needed. As an example, buried layer 32 is of type N⁺ and buried layers 31 and 33 are of type P⁺. However, any other doping configuration of the various layers may be adopted according to needs.

Similarly, the substrate will not necessarily be a homogeneous substrate, but possibly a lightly-doped layer formed on a more heavily doped layer of the same type or of the opposite conductivity type. The substrate may also correspond to an epitaxial layer formed on a substrate of the same conductivity type or of a distinct conductivity type.

Figure 4A:
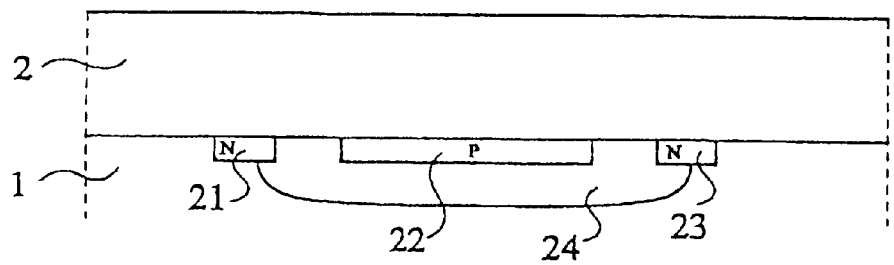
FIGS. 4A to 4C illustrate successive steps of an alternative method according to the present invention.
Figure 4B:
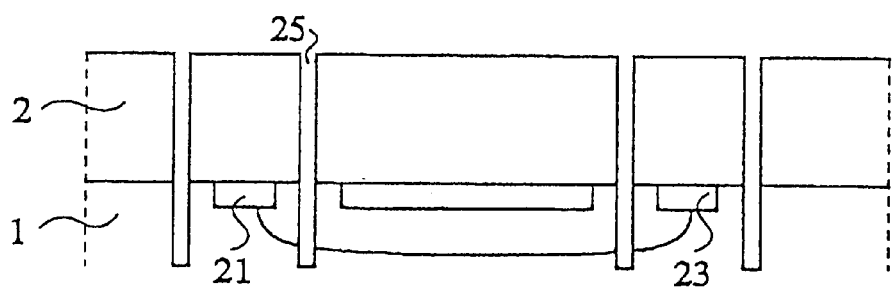
Figure 4C:
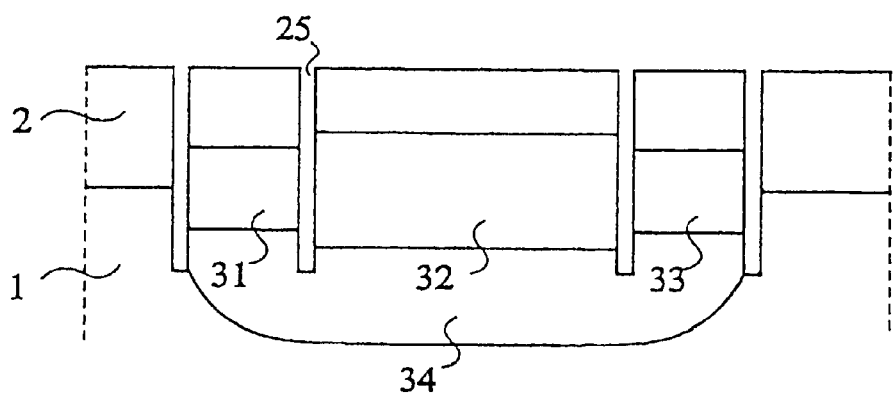

FIGS. 4A to 4C illustrate an alternative of the present invention. As described previously, the process starts from a substrate 1 in which implantations 21, 22, and 23 have been formed. However, this time, an implantation 24 corresponding to dopant atoms of the opposite conductivity type has been formed under implantation 22. For example, implantations 21 and 23 will be of type N, implantation 22 of type P and implantation 24 of type N. The dopants corresponding to implantation 24 are more deeply implanted than the dopants corresponding to implantation 22 and/or have a high diffusion speed. Preferably, as shown, layer 24 is annealed and diffused before implantations 21, 22, 23. All of this is topped with an epitaxial layer 2. At the step of FIG. 4B, as at the step of FIG. 3B, trenches 25 separating the various implanted areas are formed, after which an activation anneal of the buried layers is carried out at the step of FIG. 4C.

Trenches 25 are chosen to be sufficiently deep to block any lateral extension of diffused regions 31, 32, and 33 resulting from implanted regions 21, 22, 23. However, the extension of the diffused area coming from implantation 24 passes under adjacent trenches 25 and joins buried layers 31 and 33. This enables, if a P-type well is formed in the epitaxial layer portion located above buried layer 32, obtaining a junction insulation of the P well, topping the P⁺ layer, with respect to substrate 1. The reverse voltage biasing of this junction is performed via buried layers 31 and 33. This configuration spares a significant surface area since the lateral extension is limited by the trenches.

Of course, the present invention is likely to have various alterations, modifications, and improvements which will readily occur to those skilled in the art. In particular, while all the buried layer diffusion anneals have been described as being performed immediately after the formation of the epitaxial layer, it may be provided to perform a partial anneal at this time, followed by one or several complementary anneals corresponding to the anneals of other subsequently-formed areas of the structure.

Further, although this has not been described in detail, an insulation of the trench walls and a filling of these trenches will be conventionally performed. The insulation may, for example, be performed by thermal oxidation, possibly at the same time as the dopant redistributing anneals, and the trenches may be completely filled up by the deposition of an insulating or conductive substance, for example silicon oxide or polysilicon.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming separated doped areas close to one another in a semiconductor component, including the steps of:

forming, by implantation, separated doped areas in a semiconductor substrate;

performing a first anneal just sufficient to eliminate crystal defects resulting from the implantation;

depositing an epitaxial layer;

digging trenches delimiting each separated doped area;

performing a second anneal of the separated doped areas such that the separated doped areas diffuse to walls of the trenches, wherein the trenches are deeper than a downward extension of diffusions resulting from the second anneal of the separated doped areas and wherein, before the second anneal, a distance between a limit of the separated doped areas and the trenches that delimits the separated doped areas is small enough for obtaining a homogeneous doping of the separated doped areas after the second anneal.

2. The method of claim 1, wherein a guard distance between a trench forming mask and an implantation forming mask is on the order of 0.2 $\mu$m.

3. The method of claim 1, wherein the first anneal is performed at a temperature on the order of 900° C. for a duration shorter than one hour.

4. The method of claim 1, wherein the second anneal is performed at a temperature greater than 1000° C. for a duration greater than 20 minutes.

5. The method of claim 1, wherein the separated doped areas are implanted at a dose between $10^{14}$ and $10^{16}$ atoms/cm$^2$.

6. The method of claim 1, wherein at least one of the separated doped areas is of a first conductivity type and is formed above a previously implanted region of a second conductivity type that has been previously annealed.

7. The method of claim 6, wherein the previously implanted region diffuses sufficiently to extend under the trenches and join buried layers formed on another side of the trenches.

8. A method of forming a semiconductor device, comprising:

implanting first regions in the substrate;

performing an anneal of the substrate;

forming an epitaxial layer on the substrate;

providing trenches to delimit the first regions; and performing an anneal to diffuse the first regions to the trenches.

9. The method of claim 8, wherein the act of providing trenches comprises providing the trenches without channel stop implantations.

10. The method of claim 8, further comprising insulating walls of the trenches.

11. The method of claim 8, further comprising filling the trenches with an insulator.

12. The method of claim 8, wherein the act of providing trenches comprises providing the trenches surrounding the first regions.

13. The method of claim 8, wherein the act of providing trenches comprises creating trenches close to the first regions, such that the trenches prevent substantial diffusion of the first regions to provide an increased dopant concentration of the first regions.

14. The method of claim 8, wherein the act of performing an anneal to diffuse the first regions includes passivating flanks of the trenches.

15. The method of claim 8, wherein the act of performing an anneal to diffuse the first regions comprises performing an anneal to diffuse the first regions such that one of the first regions passes under a trench adjacent to the one of the first regions.

16. The method of claim 8, further comprising acts of:

implanting a second region into the substrate; and performing an anneal to diffuse the second region.

17. A method of forming a semiconductor device on a substrate, comprising:

creating a well in the substrate;

implanting a first region into the well;

implanting second regions into the substrate;

performing an anneal of the substrate;

forming an epitaxial layer on the substrate;

creating trenches to delimit the first region and the second regions;

performing an anneal to diffuse the first region and the second regions to the trenches.

18. The method of claim 17, wherein the act of performing an anneal to diffuse the first region and the second regions comprises performing an anneal to diffuse the well such that the well electrically connects the first region and the second regions below the trenches.

19. The method of claim 17, wherein the act of creating trenches comprises providing trenches without channel stop implantations.

20. The method of claim 17, further comprising insulating the walls of the trenches.

21. The method of claim 17, further comprising filling the trenches with an insulator.

22. The method of claim 17, wherein the act of creating trenches comprises creating trenches surrounding the first region and the second regions.

23. The method of claim 17, wherein the act of creating trenches comprises creating trenches close to the first region and the second regions, such that the trenches prevent substantial diffusion of the first region and the second regions to provide an increased dopant concentration of the first region and the second regions.

24. The method of claim 17, wherein the act of performing an anneal to diffuse the first region and the second regions includes passivating flanks of the trenches.

* * * * *